US010613776B2

(12) United States Patent
Resch

(10) Patent No.: US 10,613,776 B2
(45) Date of Patent: Apr. 7, 2020

(54) APPYLING MULTIPLE HASH FUNCTIONS TO GENERATE MULTIPLE MASKED KEYS IN A SECURE SLICE IMPLEMENTATION

(71) Applicant: International Business Machines Corporation, Armonk, NY (US)

(72) Inventor: Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 0 days.

(21) Appl. No.: 16/193,064

(22) Filed: Nov. 16, 2018

(65) Prior Publication Data

US 2019/0087109 A1 Mar. 21, 2019

Related U.S. Application Data

(62) Division of application No. 15/353,166, filed on Nov. 16, 2016, now Pat. No. 10,198,199.

(Continued)

(51) Int. Cl.
*G06F 3/00* (2006.01)
*G06F 3/06* (2006.01)
(Continued)

(52) U.S. Cl.
CPC ............ *G06F 3/0619* (2013.01); *G06F 3/064* (2013.01); *G06F 3/0608* (2013.01);
(Continued)

(58) Field of Classification Search
None
See application file for complete search history.

(56) References Cited

U.S. PATENT DOCUMENTS 4,092,732 A 5/1978 Ouchi
5,454,101 A 9/1995 Mackay et al.
(Continued)

OTHER PUBLICATIONS

V. Gadepally et al., "Computing on Masked Data to improve the security of big data," 2015 IEEE International Symposium on Technologies for Homeland Security (HST), Waltham, MA, 2015, pp. 1-6.doi: 10.1109/THS.2015.7225312 (Year: 2015).*

(Continued)

*Primary Examiner* — Daniel F. McMahon
(74) *Attorney, Agent, or Firm* — Garlick & Markison; Timothy W. Markison; Harry S. Tyson, Jr.

(57) ABSTRACT

Methods and apparatus for efficiently storing and accessing secure data are disclosed. The method of storing includes encrypting data utilizing an encryption key to produce encrypted data, performing deterministic functions on the encrypted data to produce deterministic function values, masking the encryption key utilizing the deterministic function values to produce masked keys and combining the encrypted data and the masked keys to produce a secure package. The method of accessing includes de-combining a secure package to reproduce encrypted data and masked keys, selecting a deterministic function, performing the selected deterministic function on the reproduced encrypted data to reproduce a deterministic function value, de-masking a corresponding masked key utilizing the reproduced deterministic function value to reproduce an encryption key, and decrypting the reproduced encrypted data utilizing the reproduced encryption key to reproduce data.

14 Claims, 8 Drawing Sheets

Related U.S. Application Data

(60) Provisional application No. 62/272,848, filed on Dec. 30, 2015.

(51) Int. Cl.
  G06F 16/182 (2019.01)
  G06F 16/22 (2019.01)
  G06F 12/0813 (2016.01)
  G06F 12/0888 (2016.01)
  G06F 12/14 (2006.01)
  H04L 12/26 (2006.01)
  G06F 11/10 (2006.01)
  G06F 12/06 (2006.01)
  H03M 13/15 (2006.01)
  H03M 13/37 (2006.01)
  H04L 29/08 (2006.01)

(52) U.S. Cl.
  CPC .......... G06F 3/0611 (2013.01); G06F 3/0616 (2013.01); G06F 3/0623 (2013.01); G06F 3/0644 (2013.01); G06F 3/0647 (2013.01); G06F 3/0652 (2013.01); G06F 3/0653 (2013.01); G06F 3/0659 (2013.01); G06F 3/0661 (2013.01); G06F 12/0813 (2013.01); G06F 12/0888 (2013.01); G06F 12/1408 (2013.01); G06F 16/182 (2019.01); G06F 16/2246 (2019.01); H04L 43/0888 (2013.01); G06F 3/0604 (2013.01); G06F 3/067 (2013.01); G06F 3/0631 (2013.01); G06F 3/0665 (2013.01); G06F 11/1076 (2013.01); G06F 11/1092 (2013.01); G06F 12/0684 (2013.01); G06F 2212/154 (2013.01); G06F 2212/263 (2013.01); H03M 13/1515 (2013.01); H03M 13/3761 (2013.01); H04L 43/0852 (2013.01); H04L 43/0876 (2013.01); H04L 43/16 (2013.01); H04L 67/1097 (2013.01)

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A * | 11/1999 | Garay | H04L 9/302 380/30 |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,369,514 B2 | 2/2013 | Braun et al. | |
| 9,166,956 B2 | 10/2015 | Sibert et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0189543 A1 * | 8/2007 | Gammel | H04L 9/0656 380/286 |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2013/0136258 A1 * | 5/2013 | Grube | H04L 9/14 380/44 |
| 2015/0043732 A1 * | 2/2015 | Resch | H04L 9/085 380/46 |
| 2016/0261405 A1 * | 9/2016 | Chevallier-Mames | H04L 9/0631 |

OTHER PUBLICATIONS

Chung; An Automatic Data Segmentation Method for 3D Measured Data Points; National Taiwan University; pp. 1-8; 1998.

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

LEGG; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

(56) References Cited

OTHER PUBLICATIONS

Satran, et al.; Internet Small Computer Systems Interface (iSCSI); IETF Network Working Group; RFC 3720; Apr. 2004; pp. 1-257.
Sciberras; Lightweight Directory Access Protocol (LDAP): Schema for User Applications; IETF Network Working Group; RFC 4519; Jun. 2006; pp. 1-33.
Sermersheim; Lightweight Directory Access Protocol (LDAP): The Protocol; IETF Network Working Group; RFC 4511; Jun. 2006; pp. 1-68.
Shamir; How to Share a Secret; Communications of the ACM; vol. 22, No. 11; Nov. 1979; pp. 612-613.
Smith; Lightweight Directory Access Protocol (LDAP): String Representation of Search Filters; IETF Network Working Group; RFC 4515; Jun. 2006; pp. 1-12.
Smith; Lightweight Directory Access Protocol (LDAP): Uniform Resource Locator; IETF Network Working Group; RFC 4516; Jun. 2006; pp. 1-15.
Wildi; Java iSCSi Initiator; Master Thesis; Department of Computer and Information Science, University of Konstanz; Feb. 2007; 60 pgs.
Xin, et al.; Evaluation of Distributed Recovery in Large-Scale Storage Systems; 13th IEEE International Symposium on High Performance Distributed Computing; Jun. 2004; pp. 172-181.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): Directory Information Models; IETF Network Working Group; RFC 4512; Jun. 2006; pp. 1-49.
Zeilenga; Lightweight Directory Access Protocol (LDAP): Internationalized String Preparation; IETF Network Working Group; RFC 4518; Jun. 2006; pp. 1-14.
Zeilenga; Lightweight Directory Access Protocol (LDAP): String Representation of Distinguished Names; IETF Network Working Group; RFC 4514; Jun. 2006; pp. 1-15.

\* cited by examiner

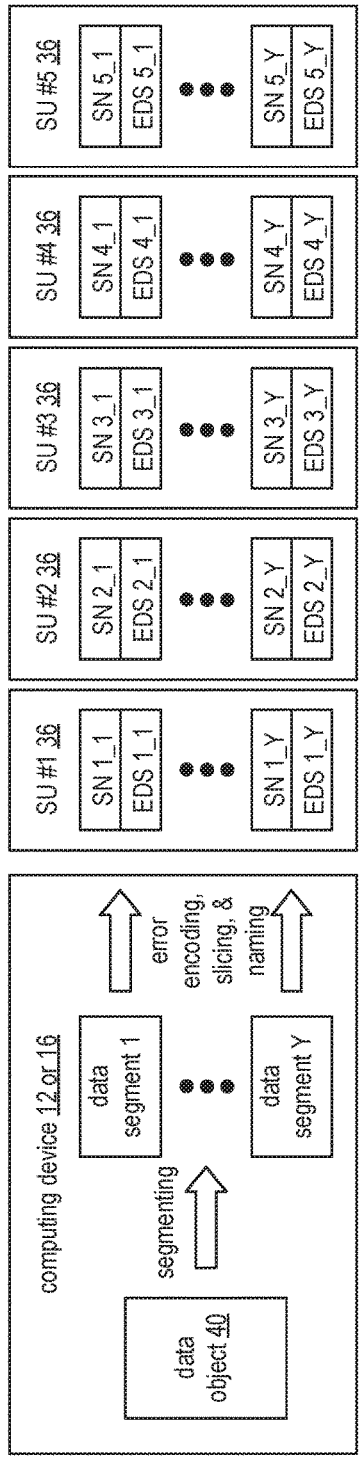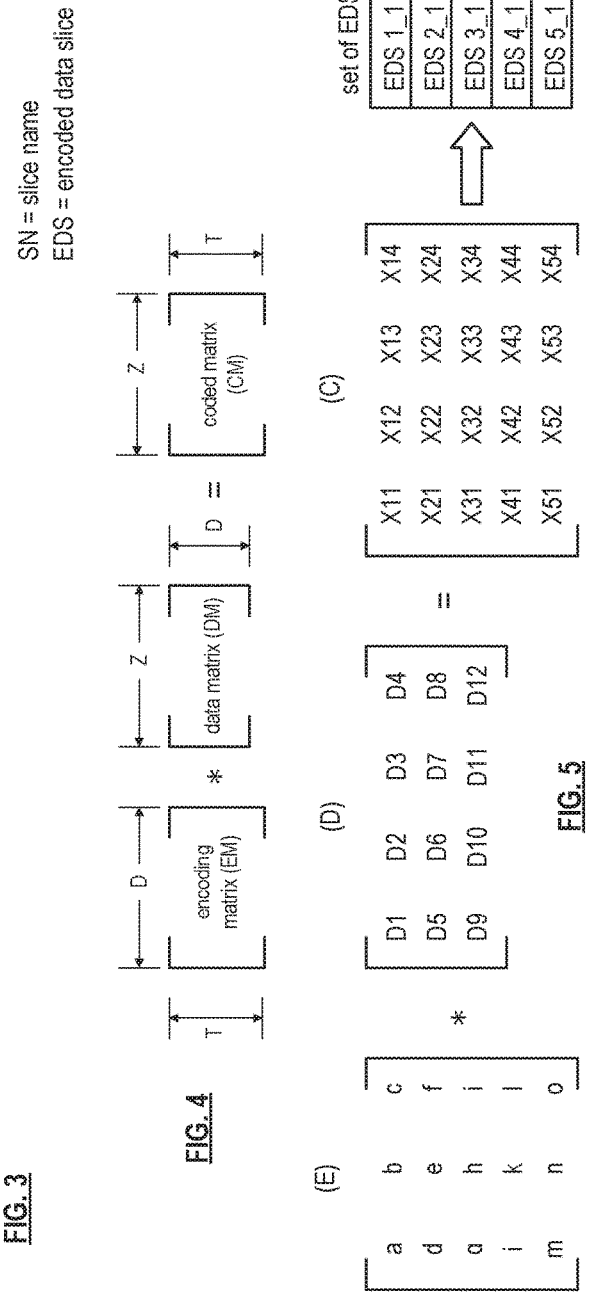

APPYLING MULTIPLE HASH FUNCTIONS TO GENERATE MULTIPLE MASKED KEYS IN A SECURE SLICE IMPLEMENTATION

CROSS REFERENCE TO RELATED APPLICATIONS

The present U.S. Utility Patent Application claims priority pursuant to 35 U.S.C. § 121 as a divisional of U.S. Utility application Ser. No. 15/353,166, entitled "APPLYING MULTIPLE HASH FUNCTIONS TO GENERATE MULTIPLE MASKED KEYS IN A SECURE SLICE IMPLEMENTATION", filed Nov. 16, 2016, which claims priority pursuant to 35 U.S.C. § 119(e) to U.S. Provisional Application No. 62/272,848, entitled "OPTIMIZING UTILIZATION OF STORAGE MEMORY IN A DISPERSED STORAGE NETWORK", filed Dec. 30, 2015, (expired), both of which are hereby incorporated herein by reference in their entirety and made part of the present U.S. Utility Patent Application for all purposes.

BACKGROUND OF THE INVENTION

Technical Field of the Invention

This invention relates generally to computer networks, and more particularly to dispersed or cloud storage.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote or Internet storage system. The remote or Internet storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE SEVERAL VIEWS OF THE DRAWING(S)

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of slice naming information for an encoded data slice (EDS) in accordance with the present disclosure;

DETAILED DESCRIPTION OF THE INVENTION

Figure 1:
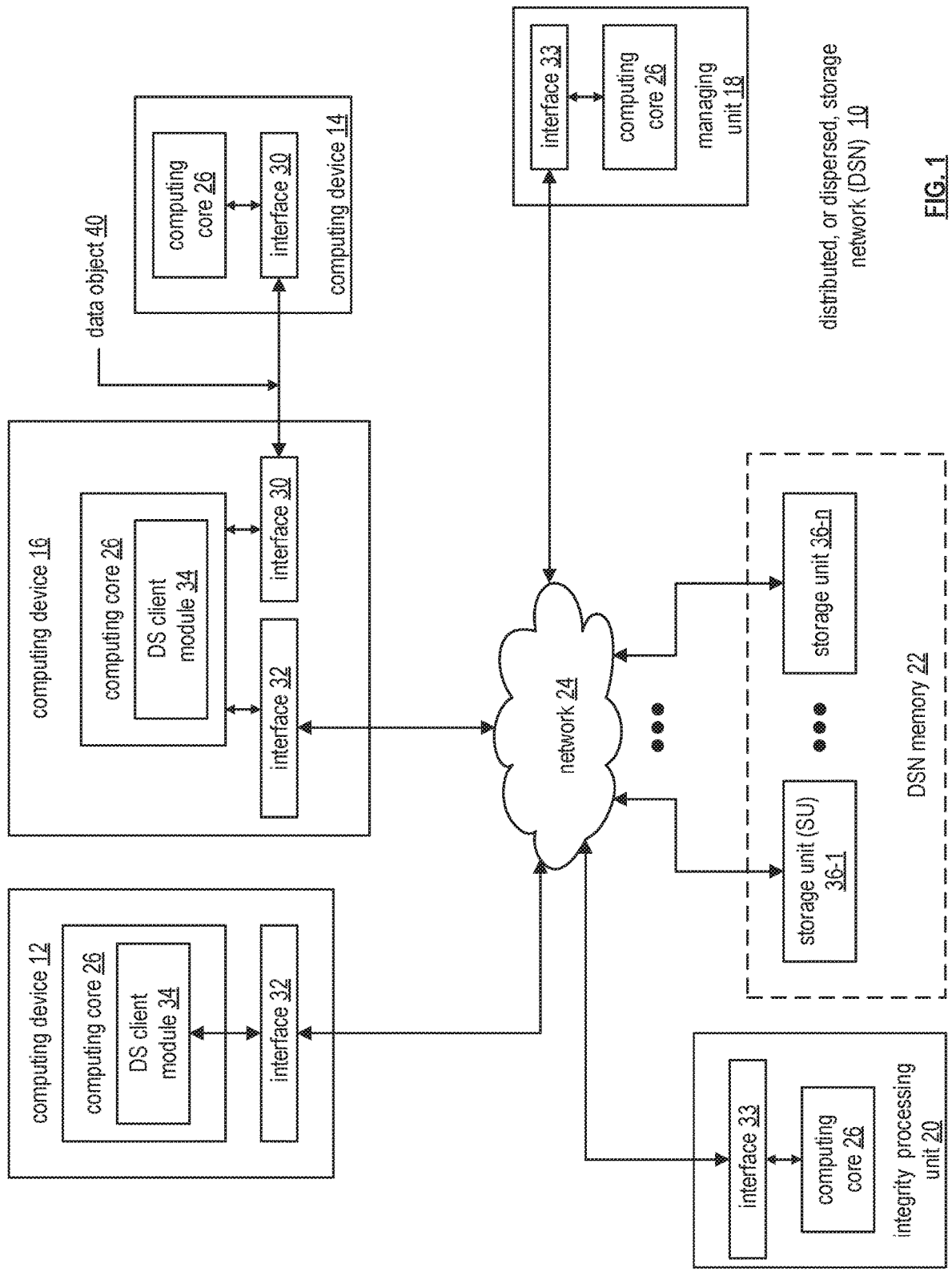
FIG. 1 is a schematic block diagram of an embodiment of a dispersed, or distributed, storage network (DSN) in accordance with the present disclosure.

FIG. 1 is a schematic block diagram of an embodiment of a dispersed, or distributed, storage network (DSN) 10 that includes a plurality of dispersed storage (DS) computing devices or processing units 12-16, a DS managing unit 18, a DS integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

The DSN memory 22 includes a plurality of dispersed storage units 36 (DS units) that may be located at geographically different sites (e.g., one in Chicago, one in Milwaukee, etc.), at a common site, or a combination thereof. For example, if the DSN memory 22 includes eight dispersed storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36.

DS computing devices 12-16, the managing unit 18, and the integrity processing unit 20 include a computing core 26, and network or communications interfaces 30-33 which can be part of or external to computing core 26. DS computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the dispersed storage units 36.

Each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

In general, and with respect to DS error encoded data storage and retrieval, the DSN 10 supports three primary operations: storage management, data storage and retrieval. More specifically computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing or hacking the data).

The second primary function (i.e., distributed data storage and retrieval) begins and ends with a DS computing devices 12-14. For instance, if a second type of computing device 14 has data 40 to store in the DSN memory 22, it sends the data 40 to the DS computing device 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.).

In operation, the managing unit 18 performs DS management services. For example, the managing unit 18 establishes distributed data storage parameters (e.g., vault creation, distributed storage parameters, security parameters, billing information, user profile information, etc.) for computing devices 12-16 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information. As will be described in more detail in conjunction with FIG. 10A and 10B, usage can be determined by a managing unit 18 on a byte-hour basis.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network operations can further include monitoring read, write and/or delete communications attempts, which attempts could be in the form of requests. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

To support data storage integrity verification within the DSN 10, the integrity processing unit 20 (and/or other devices in the DSN 10 such as managing unit 18) may assess and perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are assessed and checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, managing unit 18, stored on a DS unit 36, and/or distributed among multiple storage units 36.

Figure 2:
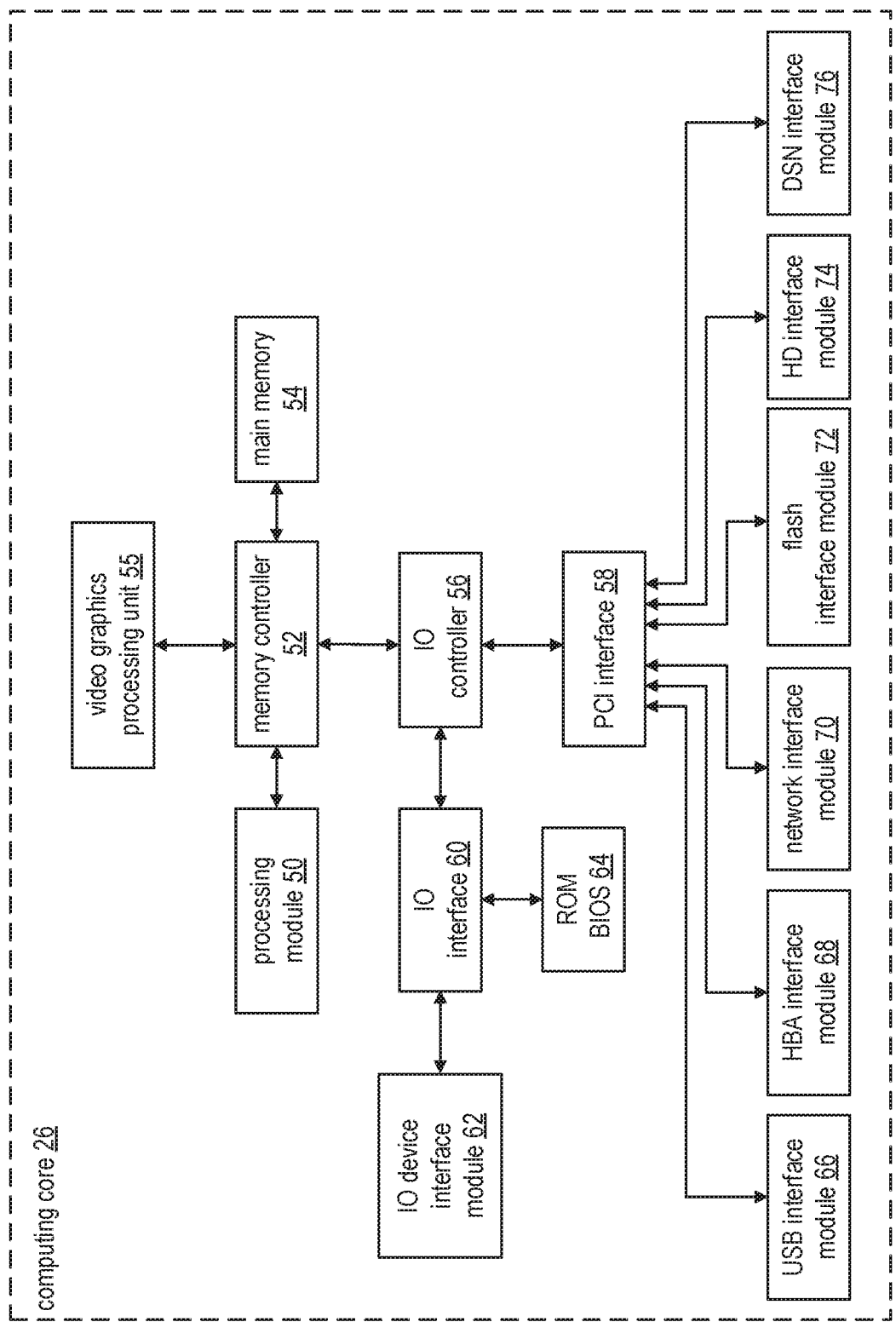
FIG. 2 is a schematic block diagram of an embodiment of a computing core in accordance with the present disclosure.

FIG. 2 is a schematic block diagram of an embodiment of a computing core 26 that includes a processing module 50, a memory controller 52, main memory 54, a video graphics processing unit 55, an input/output (10) controller 56, a peripheral component interconnect (PCI) interface 58, an IO interface module 60, at least one I0 device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value X11=aD1+bD5+cD9, X12=aD2+bD6+cD10, . . . X53=mD3+nD7+oD11, and X54=mD4+nD8+oD12.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
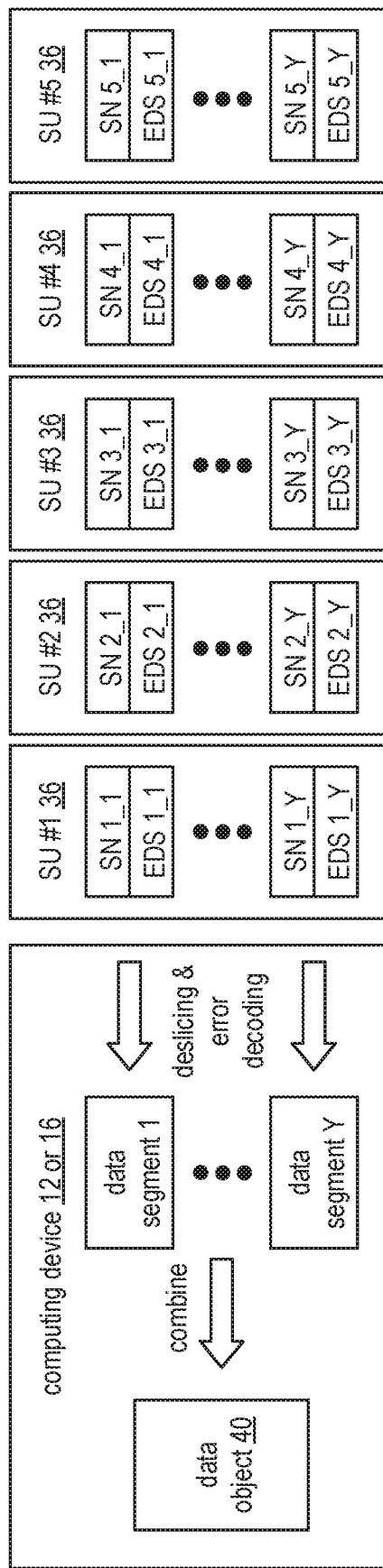
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
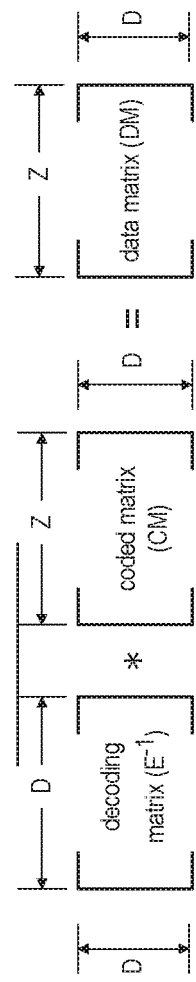
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
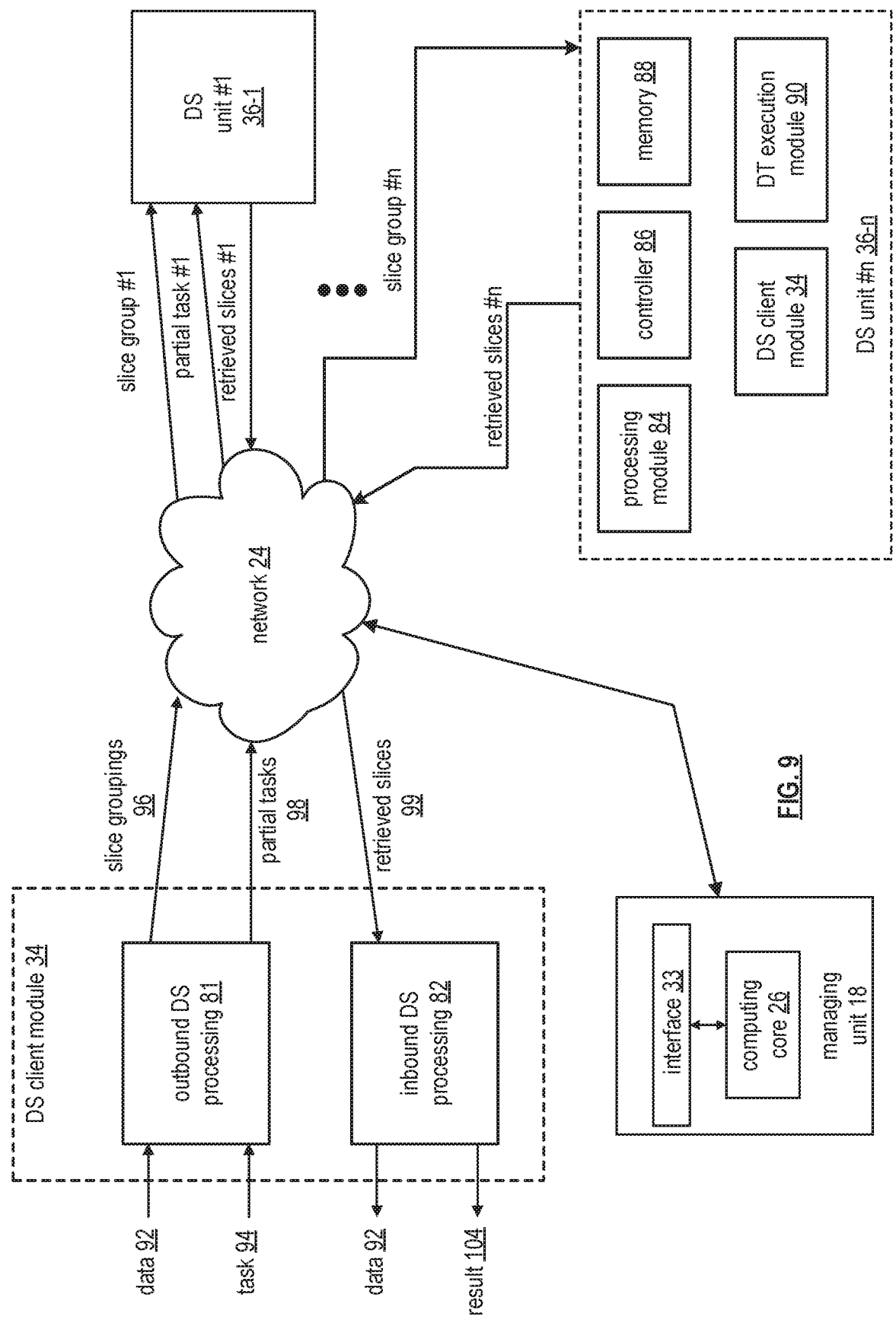
FIG. 9 is a schematic block diagram of an example of a dispersed storage network in accordance with the present disclosure.

FIG. 9 is a diagram of an example of a dispersed storage network. The dispersed storage network includes a DS (dispersed storage) client module 34 (which may be in DS computing devices 12 and/or 16 of FIG. 1), a network 24, and a plurality of DS units 36-1 . . . 36-n (which may be storage units 36 of FIG. 1 and which form at least a portion of DS memory 22 of FIG. 1), a DSN managing unit 18, and a DS integrity verification module (not shown). The DS client module 34 includes an outbound DS processing section 81 and an inbound DS processing section 82. Each of the DS units 36-1 . . . 36-n includes a controller 86, a processing module 84 (e.g. computer processor) including a communications interface for communicating over network 24 (not shown), memory 88, a DT (distributed task) execution module 90, and a DS client module 34.

In an example of operation, the DS client module 34 receives data 92. The data 92 may be of any size and of any content, where, due to the size (e.g., greater than a few Terabytes), the content (e.g., secure data, etc.), and/or concerns over security and loss of data, distributed storage of the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DS client module 34, the outbound DS processing section 81 receives the data 92. The outbound DS processing section 81 processes the data 92 to produce slice groupings 96. As an example of such processing, the outbound DS processing section 81 partitions the data 92 into a plurality of data partitions. For each data partition, the outbound DS processing section 81 dispersed storage (DS) error encodes the data partition to produce encoded data slices and groups the encoded data slices into a slice grouping 96.

The outbound DS processing section 81 then sends, via the network 24, the slice groupings 96 to the DS units 36-1 . . . 36-n of the DSN memory 22 of FIG. 1. For example, the outbound DS processing section 81 sends slice group 1 to DS storage unit 36-1. As another example, the outbound DS processing section 81 sends slice group #n to DS unit #n.

In one example of operation, the DS client module 34 requests retrieval of stored data within the memory of the DS units 36. In this example, the task 94 is retrieve data stored in the DSN memory 22. Accordingly, and according to one embodiment, the outbound DS processing section 81 converts the task 94 into a plurality of partial tasks 98 and sends the partial tasks 98 to the respective DS storage units 36-1 . . . 36-n.

In response to the partial task 98 of retrieving stored data, a DS storage unit 36 identifies the corresponding encoded data slices 99 and retrieves them. For example, DS unit #1 receives partial task #1 and retrieves, in response thereto, retrieved slices #1. The DS units 36 send their respective retrieved slices 99 to the inbound DS processing section 82 via the network 24.

The inbound DS processing section 82 converts the retrieved slices 99 into data 92. For example, the inbound DS processing section 82 de-groups the retrieved slices 99 to produce encoded slices per data partition. The inbound DS processing section 82 then DS error decodes the encoded slices per data partition to produce data partitions. The inbound DS processing section 82 de-partitions the data partitions to recapture the data 92.

In one example of operation, the DSN of FIG. 1 may be utilized for storing and accessing secure data. Explanations of this process are set out below in conjunction with FIGS. 10A, 10B and 10C. While described in the context of functionality provided by DS processing unit 16, this functionality may be implemented utilizing any module and/or unit of the dispersed storage network (DSN) including the DS Processing Integrity Unit 20, DS Managing Unit 18, and/or one or more DS units 36 shown in FIG. 1.

Different CPU architectures are better suited for computing different hash functions. For example, in pure software MD5 may be faster than SHA-256 or GHASH. While certain CPU instructions may make GHASH faster, or SHA-256 faster, these instructions and optimizations for different algorithms are not universally available. Therefore, in a DSN memory supporting disparate and heterogeneous access devices, it can be useful and prudent to encode data in a way that is efficient to access for a wide class of users and DS processing units. To achieve this in the AONT (all or nothing transform) algorithm, one approach is to modify the algorithm as follows: 1. Data (D) to be encoded is appended with a known expected value; 2. D is encrypted with a randomly generated key: (R) to yield encrypted data: (E); 3. At least one hash function, $H\_0, H\_1, \ldots, H\_n$ are computed over E; 4. This results in at least one hash value $V\_0=H\_0(E), V\_1=H\_1(E), \ldots, V\_n=H\_n(E)$; 5. Each hash value V_i is masked with the key by securely combining it (e.g. by XOR or modular addition) with R, to yield masked keys M_0=(V_0 xor R), M_1=(V_1 xor R), . . . , M_n=(V_n xor R); and 6. The secure package (P) is formed as the concatenation of E, and each of the masked keys, for example: P=E∥M_0∥M_1∥ . . . ∥M_n.

This completes the encoding of the secure package. In this way, the data can be decoded by computing any one of the hash functions applied over the data during decoding. When decoding, the decoder can select whichever hash function is fastest for example, or most efficient, uses least memory, is most-secure, etc. For example, if the decoder wishes to use H_i, the decoder computes V_i=H_i(E), then de-combines V_i from M_i (e.g., by XOR or modular subtraction) to recover R. Then with R, the decoder decrypts E to recover the original data D. Note that encoding additional hash functions is a curtesy which makes the encoding/storing/writing step more expensive, but has the potential to make reading/retrieving/decoding less expensive. A DS processing unit 16 may selectively decide to encode additional hash functions when it determines that the data is likely to be read many times, or alternatively, as a way to provide future proofing: if some algorithms in the future fall out of favor or use, the multiple encodings make it easier to support and implement decoding functions.

Figure 10A:
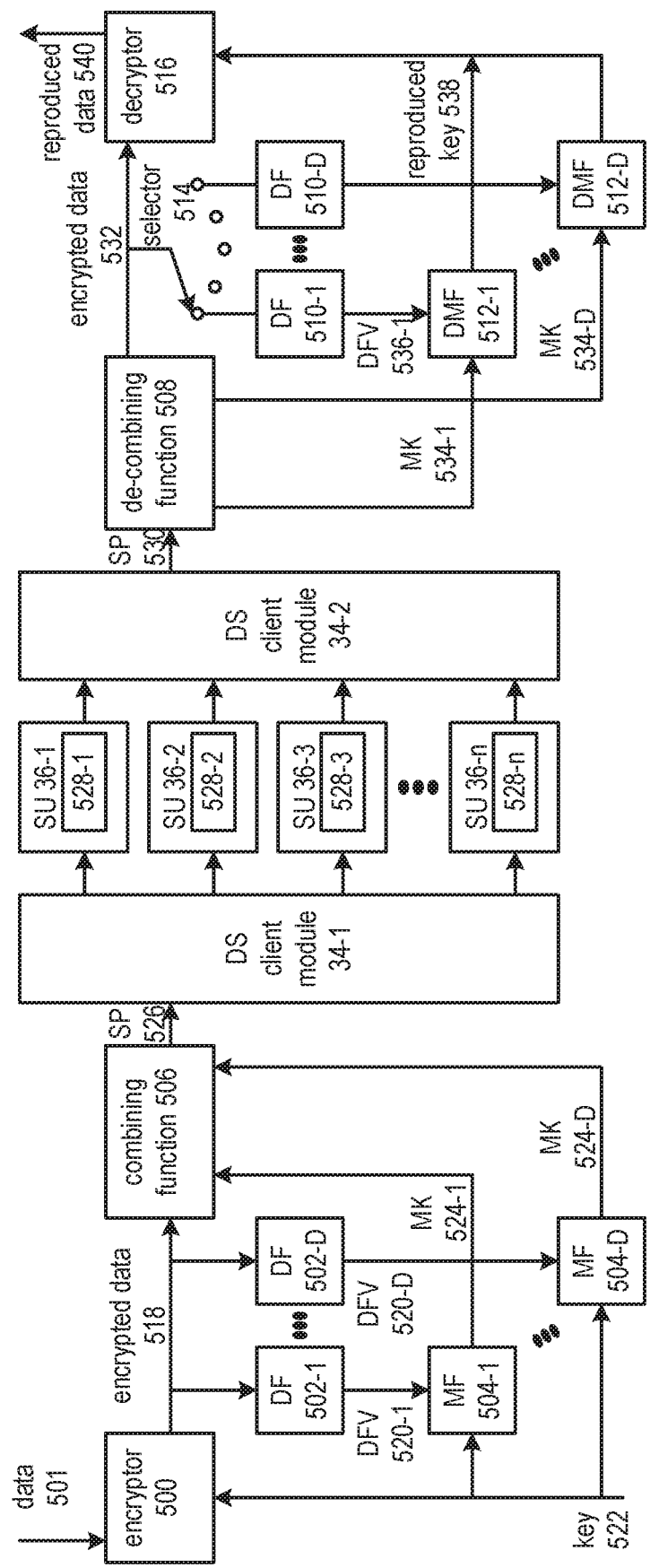
FIG. 10A is a schematic block diagram of another embodiment of a dispersed storage network in accordance with the present disclosure.

FIG. 10A is a schematic block diagram of another embodiment of a dispersed storage network that includes an encryptor 500, a plurality of deterministic functions 502-1 to 502-D, a plurality of masking functions 504-1 to 504-D, and combining functions 506, distributed storage (DS) client module's 34-1 and 34-2, a set of storage units 36-1 to 36-n, a de-combining function 508, and another plurality of deterministic functions 510-1 to 510-D, a plurality of de-masking functions 512-1 to 512-D, a selector 514 and a decryptor 516. Each storage unit may be implemented utilizing the DS execution unit 36 of FIG. 1. The DS client modules 34-1 and 34-2 may be implemented utilizing the DS client module 34 of FIG. 1. Each of the other functions and modules may be implemented utilizing the processing module 84 of FIG. 9. The DSN functions to efficiently store and access secure data.

In an example of operation of the efficient storage of secure data, encryptor 500 encrypts data 501 utilizing an encryption key 522 (e.g., a random key, a retrieve key, a received key) to produce encrypted data 518. Each of the plurality of deterministic functions 502-1 to 502-D performs a corresponding deterministic function on the encrypted data 518 to produce a plurality of deterministic function values 520-1 to 520-D (e.g., with substantially the same number of bits as the encryption key 522). The deterministic function includes at least one of a hashing function (e.g., MD5, SHA-256, GHASH, etc.), a sponge function, and a mask generating function. Each of the plurality of masking functions masks the encryption key 522 with a corresponding deterministic function value to produce a corresponding mask key of a plurality of masked keys MK 524-1- MK 524-D. The masking function includes modular addition, e.g., an exclusive OR function. The combining function combines (e.g., appends, interleaves, encodes) the encrypted data 518 and the plurality of masked keys 524-1 to 524-D to produce a secure package 526, where the DS client module 34-1 dispersed storage error encodes the secure package to produce a set of encoded data slices 528-1 to 528-n for storage in the set of storage units 36-1 to 36-n. For example, the DS client module 34-1 matrix multiplies the secure package by an encoding matrix to produce the set of encoded data slices, where the encoding matrix includes a unity matrix.

When recovering or accessing the securely stored data, the de-combining function 508 de-combines the received secure package 530 from the DS client module 34-2 to reproduce encrypted data 532 (reproduced encrypted data) and a plurality of masked keys MK 534-1 to MK 534-D, where the DS client module 34-2 dispersed storage error decodes a decode threshold number of encoded data slices of the set of encoded data slices 528-1 to 528-n to reproduce secure package 530 (reproduced secure package). The selector 514 selects a deterministic function 510-1 to 510-D based on one or more characteristics (e.g., speed, security, processing load, resource utilization level, and efficiency level) of one or more, including each, deterministic function. For example, the selector 514 selects the deterministic function 510-1 when the deterministic function 510-1 is associated with a higher than average efficiency level of operation when implemented within software. The selected deterministic function 510 used in performing the decode is one of the deterministic functions 502 used to perform the encode.

With the deterministic function selected 510-1, the selected deterministic function performs a corresponding deterministic function on the reproduced encrypted data 532 to reproduce a corresponding deterministic function value (e.g., reproduced deterministic function value DFV 536-1). The corresponding de-masking function (e.g., DMF 512-1) de-masks a masked key (e.g., MK 534-1) corresponding to the selected deterministic function utilizing the reproduced corresponding deterministic function value 536-1 to produce a reproduced encryption key 538. The de-masking function includes modular subtraction (e.g., the exclusive OR). The decryptor 516 decrypts the reproduced encrypted data 518 utilizing the reproduced encryption key 538 to produce reproduce data 540.

Figure 10B:
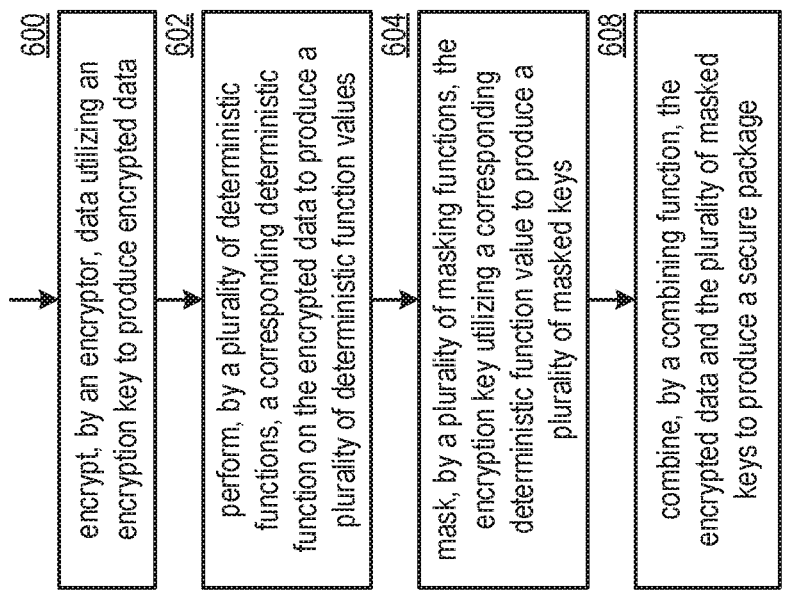
FIG. 10B is a flowchart illustrating an example of efficiently storing secure data in accordance with the present disclosure.

FIG. 10B is a flowchart illustrating an example of efficiently storing secure data. The method includes a step 600 where an encryptor (e.g., of a distributed storage (DS) processing unit) encrypts data utilizing an encryption key to produce encrypted data. The method continues at the step 602 where a plurality of deterministic functions performs a corresponding deterministic function on the encrypted data to produce a plurality of deterministic function values. For example, each deterministic function performs the corresponding deterministic function on the encrypted data to produce a deterministic function value that includes a number of bits that is substantially the same as a number of bits of encryption key.

The method continues at the step 604 where a plurality of masking functions masks the encryption key utilizing a corresponding deterministic function value to produce a plurality of masked keys. For example, each masking function performs an exclusive OR function on the encryption key and the corresponding deterministic function value to produce the masked key. The method continues at the step 608 where a combining function combines the encrypted data and the plurality of masked keys to produce a secure package. For example, the combining function appends each of the masked keys to the encrypted data to produce the secure package.

Figure 10C:
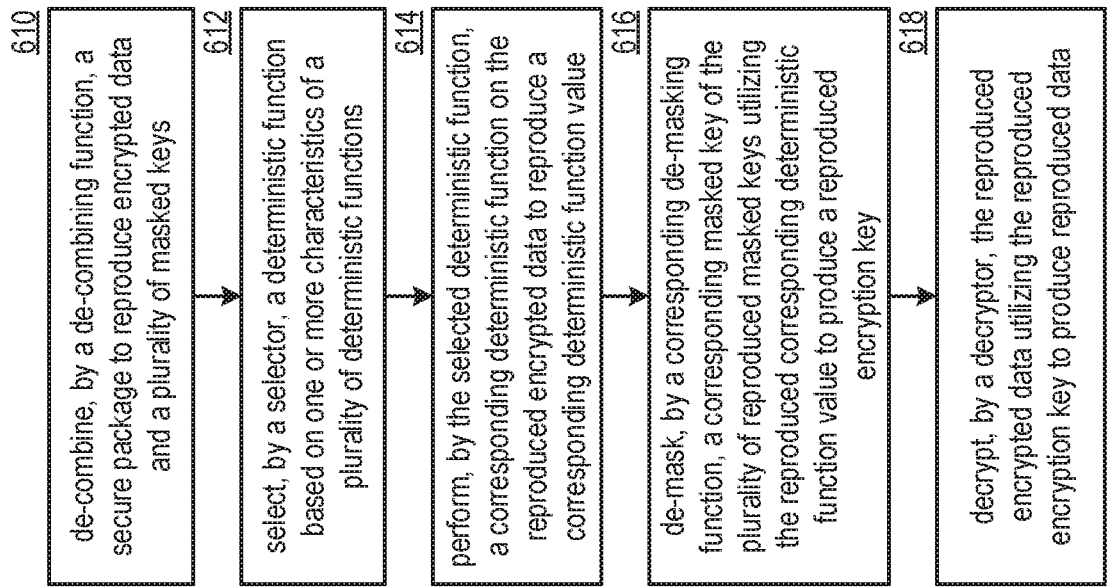
FIG. 10C is a flowchart illustrating an example of efficiently accessing secure data in accordance with the present disclosure.

FIG. 10C is a flowchart illustrating an example of efficiently accessing secure data. When recovering or accessing data, the method begins at the step 610 where a de-combining function de-combines a secure package to reproduce encrypted data and a plurality of masked keys. For example, the de-combining function de-appends the plurality of masked keys from the encrypted data. The method continues at the step 612 where a selector selects a deterministic function based on one or more characteristics of a plurality of deterministic functions. For example, the selector selects a deterministic function associated with speed of execution when quick recovery of the data is desired. As another example, the selector selects another deterministic function associated with efficiency of operation when a processing resource availability level is below average.

The method continues at the step 614 where the selected deterministic function performs a corresponding deterministic function on the reproduced encrypted data to reproduce a corresponding deterministic function value (a reproduced deterministic function value). The method continues at the step 616 where a corresponding de-masking function de-masks a corresponding masked key of the plurality of reproduced masked keys utilizing the reproduced corresponding deterministic function value to produce a reproduced encryption key. For example, the de-masking function performs the exclusive OR function on the corresponding masked key utilizing the reproduced corresponding deterministic function value to produce the reproduced encryption key. The method continues at the step 618 where a decryptor decrypts the reproduced encrypted data utilizing the reproduced encryption key to produce reproduced data.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal A has a greater magnitude than signal B, a favorable comparison may be achieved when the magnitude of signal A is greater than that of signal B or when the magnitude of signal B is less than that of signal A. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information. A computer readable memory/storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the DSN including a plurality of storage units, the method comprising:
   encrypting data utilizing an encryption key to produce encrypted data;
   performing a plurality of deterministic functions on the encrypted data to produce a plurality of deterministic function values;
   masking the encryption key utilizing the plurality of deterministic function values to produce a plurality of masked keys;
   combining the encrypted data and the plurality of masked keys to produce a secure package;
   dispersed storage error encoding the secure package;
   sending the dispersed storage error encoded secure package to the plurality of storage units for dispersed storage;
   receiving, by a computing device of the DSN, the secure package from the plurality of storage units;
   de-combining the secure package to reproduce the encrypted data and the plurality of masked keys;
   selecting a selected deterministic function of the plurality of deterministic functions based on one or more characteristics of the plurality of deterministic functions;
   performing the selected deterministic function on the encrypted data to reproduce a deterministic function value of the plurality of deterministic function values;
   de-masking a masked key of the plurality of masked keys corresponding to the selected deterministic function using the reproduced deterministic function value to produce an encryption key; and
   decrypting the encrypted data utilizing the encryption key to produce reproduced data.

2. The method of claim 1, wherein each of the plurality of deterministic function values includes a first number of bits that is the same as a second number of bits of the encryption key.

3. The method of claim 1, wherein masking the encryption key utilizing the plurality of deterministic function values includes performing an exclusive OR function on the encryption key and the plurality of deterministic function values.

4. The method of claim 1, wherein combining the encrypted data and the plurality of masked keys to produce a secure package includes appending each of the plurality of masked keys to the encrypted data.

5. The method of claim 1, wherein de-combining the secure package to reproduce the encrypted data and the plurality of masked keys includes de-appending the plurality of masked keys from the encrypted data.

6. The method of claim 1, wherein the one or more characteristics of the plurality of deterministic functions includes speed of execution.

7. The method of claim 1, wherein the one or more characteristics of the plurality of deterministic functions includes processing efficiency of operation.

8. The method of claim 1, wherein the step of de-masking the masked key of the plurality of masked keys corresponding to the selected deterministic function of the plurality of deterministic functions using the deterministic function value to produce the encryption key includes performing an exclusive OR function on the masked key of the plurality of masked keys corresponding to the selected deterministic function of the plurality of deterministic functions utilizing the deterministic function value.

9. The method of claim 1, further comprising the step of dispersed storage error decoding the dispersed storage error encoded secure package to reproduce the secure package.

10. A computer readable storage medium comprises:
   at least one memory section that stores operational instructions that, when executed by one or more processing modules of one or more computing devices of a dispersed storage network (DSN), causes the one or more computing devices to:
      encrypt data utilizing an encryption key to produce encrypted data;
      perform a plurality of deterministic functions on the encrypted data to produce a plurality of deterministic function values;
      mask the encryption key utilizing the plurality of deterministic function values to produce a plurality of masked keys;
      combine the encrypted data and the plurality of masked keys to produce a secure package;
      dispersed storage error encode the secure package;
      send the dispersed storage error encoded secure package to a plurality of storage units for dispersed storage;
      receive the secure package from the plurality of storage units;
      de-combine the secure package to reproduce the encrypted data and the plurality of masked keys;
      select a selected deterministic function of the plurality of deterministic functions based on one or more characteristics of the plurality of deterministic functions;
      perform the selected deterministic function on the encrypted data to reproduce a deterministic function value of the plurality of deterministic function values;
      de-mask a masked key of the plurality of masked keys corresponding to the selected deterministic function using the reproduced deterministic function value to produce an encryption key; and
      decrypt the encrypted data utilizing the encryption key to produce reproduced data.

11. The computer readable storage medium of claim 10, wherein each of the plurality of deterministic function values includes a first number of bits that is the same as a second number of bits of the encryption key.

12. The computer readable storage medium of claim 10, wherein masking the encryption key utilizing the plurality of deterministic function values includes performing an exclusive OR function on the encryption key and the plurality of deterministic function values.

13. The computer readable storage medium of claim 10, wherein combining the encrypted data and the plurality of masked keys to produce a secure package includes appending each of the plurality of masked keys to the encrypted data.

14. The computer readable storage medium of claim 10 comprising further operational instructions that, when executed by the one or more processing modules, causes the one or more computing devices of the DSN to send the dispersed storage error encoded secure package to a plurality of storage units for dispersed storage.

* * * * *